United States Patent
Sim

(10) Patent No.: US 6,483,351 B2
(45) Date of Patent: Nov. 19, 2002

(54) INPUT-OUTPUT LINE SENSE AMPLIFIER HAVING SMALL CURRENT CONSUMPTION AND DIRECT CURRENT

(75) Inventor: Jae-Yoon Sim, Kyungki-do (KR)

(73) Assignee: Samsung Electronics Co., Ltd., Hwasung (KR)

( * ) Notice: Subject to any disclaimer, the term of this patent is extended or adjusted under 35 U.S.C. 154(b) by 0 days.

(21) Appl. No.: 09/995,498

(22) Filed: Nov. 26, 2001

(65) Prior Publication Data

US 2002/0118047 A1 Aug. 29, 2002

(30) Foreign Application Priority Data

Feb. 26, 2001 (KR) ............................... 01-9606

(51) Int. Cl.[7] ............................... G11C 7/06
(52) U.S. Cl. ............... 327/52; 327/51; 327/57
(58) Field of Search ............... 327/51–57, 65, 327/66; 365/185.21, 189.05, 203, 205, 207

(56) References Cited

U.S. PATENT DOCUMENTS

| 5,528,543 | A | * | 6/1996 | Stiegler | 327/52 |
|---|---|---|---|---|---|
| 5,648,935 | A | * | 7/1997 | Koh et al. | 327/55 |
| 5,856,748 | A | * | 1/1999 | Seo et al. | 327/52 |
| 5,886,546 | A | * | 3/1999 | Hwang | 327/53 |
| 6,097,633 | A | * | 8/2000 | La Placa | 365/185.21 |

* cited by examiner

Primary Examiner—Toan Tran
(74) Attorney, Agent, or Firm—Marger Johnson & McCollom, P.C.

(57) ABSTRACT

An input-output line sense amplifier of a semiconductor memory device that consumes a small amount of current and direct current (DC), includes a current sensing circuit for sensing only a portion of the current through the input-output line and the complementary input-output line, a first amplifier operating from another portion of the sensed current and of the complementary current to amplify and invert a first detected output signal of the current sensing circuit, a second amplifier operating from yet another portion of the sensed current and of the complementary current to amplify and invert a second detected output signal of the current sensing circuit.

11 Claims, 4 Drawing Sheets

INPUT-OUTPUT LINE SENSE AMPLIFIER HAVING SMALL CURRENT CONSUMPTION AND DIRECT CURRENT

This application claims priority from Korean Priority Document No. 01-9606, filed on Feb. 26, 2001 with the Korean Industrial Property Office, which document is hereby incorporated by reference.

BACKGROUND OF THE INVENTION

1. Field of the Invention

The present invention relates to semiconductor memory device, and more particularly, to an input-output line sense amplifier of a semiconductor memory device.

2. Description of the Related Art

Referring to FIG. 1, a memory cell array 11 is a semiconductor memory device that includes a memory cell 111. In a data read operation, predetermined data stored in memory cell 111 are amplified through a pair of bit lines BL and BLB by a bit line sense amplifier 112. An amplified signal is transmitted through column selecting transistors 113 and 114 to a pair of local input-output lines IO and IOB and a pair of global input-output lines DIO and DIOB. Data of the global input-output lines DIO and DIOB are amplified by an input-output line sense amplifier (IOSA) 13 and then is output to the outside via an output buffer 15 and an output pin DQ.

In the prior art it has been difficult to make the input-output line sense amplifier 13. In general, the options are to make it either as a current sense amplifier or a voltage sense amplifier.

The problem is that, when reading data, there is little difference between voltages of the input-output line DIO and DIOB. Thus, there is a very small difference to detect. Accordingly, the current sensing amplifier is widely preferred, since its sensing and amplifying speeds are faster than that of the voltage sense amplifier. But that is not enough, either. Since the output signal of a current sense amplifier has low voltage level, a voltage sense amplifier is then added afterwards to convert it to a CMOS level. But including the voltage sense amplifier decreases the overall sensing and amplifying speeds.

Referring to FIG. 2, a prior art implementation is shown for the input-output line sense amplifier 13. In the input-output line sense amplifier (IOSA) 13, a signal output from a current sense amplifier (CSA) 131 is amplified by a voltage sense amplifier (VSA) 132 and then is input into a latch 133. The latch 133 transforms the signal amplified by the voltage sense amplifier (VSA) 132 to a CMOS level.

FIG. 3 is a circuit diagram of the current sense amplifier (CSA) 131 shown in FIG. 2. Here, Mp11 and Mp12 represent PMOS transistors, and Mn11, Mn12, and Mn13 represent NMOS transistors. DIO and DIOB represent a pair of input-output lines, and EN represents an enabling signal.

FIG. 4 is a circuit diagram of the voltage sense amplifier (VSA) 132 shown in FIG. 2. Referring to FIG. 4, the voltage sense amplifier (VSA) 132 has the structure of a differential amplifier. Here, Mp31 through Mp34 represent PMOS transistors and Mn31 through Mn35 represent NMOS transistors. O1 and O1B represent a pair of output signals output from the current sense amplifier (CSA) 131, and EN represents an enabling signal.

FIG. 5 is a circuit diagram of the latch 133 shown in FIG. 2. Here, Mp41 through Mp44 represent PMOS transistors, and Mn41 through Mn43 represent NMOS transistors. O2 and O2B represent a pair of output signals of the voltage sense amplifier (VSA) 132, and LAT represents a latch enabling signal. DOUT and DOUTB represent a pair of output signals output from the latch 133 of the input-output line sense amplifier (IOSA) 13 shown in FIG. 2.

The conventionally made input-output line sense amplifier (IOSA) 13 described above consumes a large amount of current, which is undesirable. Worse, it includes the voltage sense amplifier (VSA) 132 having the structure of a differential amplifier, thus increasing direct current (DC) voltage.

SUMMARY OF THE INVENTION

The invention provides an input-output line sense amplifier of a semiconductor memory device, which senses an input-output line and a complementary input-output line transmitting data read from a memory cell.

The device of the invention includes a current sensing circuit for sensing a first portion of the signal current and a first portion of the complementary current. It also includes a first amplifier operating from a second portion of the signal current and a second portion of the complementary current to generate an output signal from a first detected output of the current sensing circuit, and a second amplifier operating from a third portion of the signal current and a third portion of the complementary current to generate an output signal from a second detected output of the current sensing circuit. A latch receives the output signals generated by the first and second amplifiers.

Preferably the second portion of the signal current corresponds to an equal fraction of the signal current as the second portion of the complementary current.

The input-output line sense amplifier does not include a voltage sense amplifier having the structure of a differential amplifier, and thus it consumes only a small amount of current and direct current (DC) compared to the prior art.

BRIEF DESCRIPTION OF THE DRAWINGS

The above object and advantages of the present invention will become more apparent by describing in detail a preferred embodiment thereof with reference to the attached drawings in which.

DESCRIPTION OF THE PREFERRED EMBODIMENT

Figure 1:
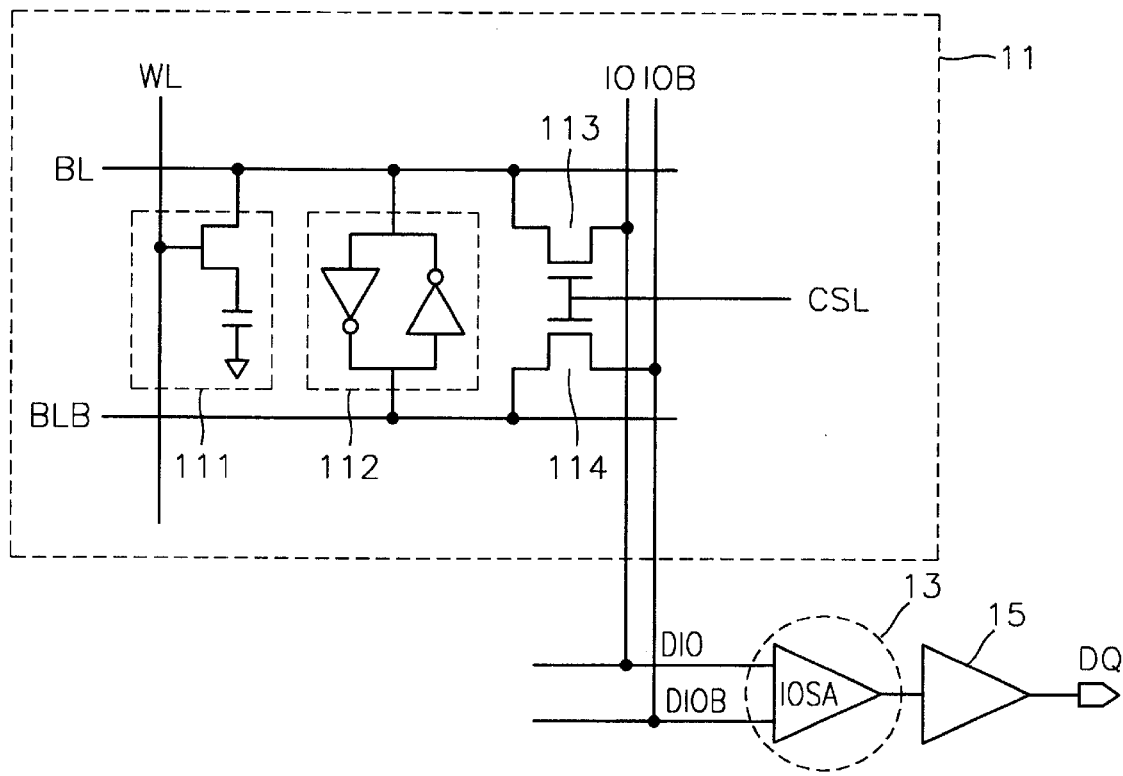
FIG. 1 is a diagram of a memory cell array of a semiconductor memory device in which the invention may be implemented.
Figure 2:
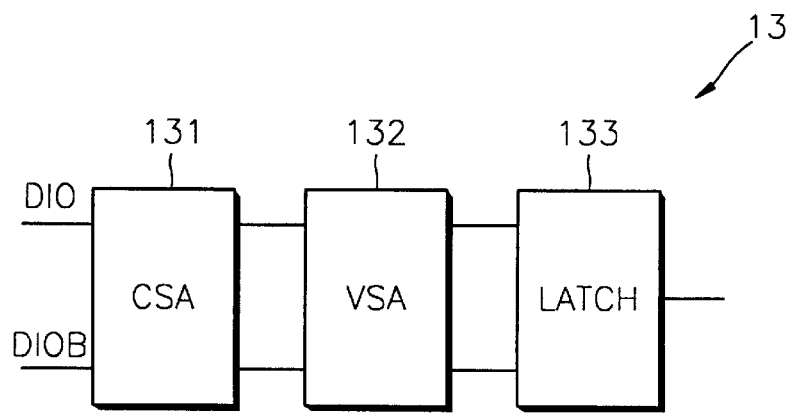
FIG. 2 is a circuit diagram of an input output line sense amplifier shown in FIG. 1, made according to the prior art.
Figure 3:
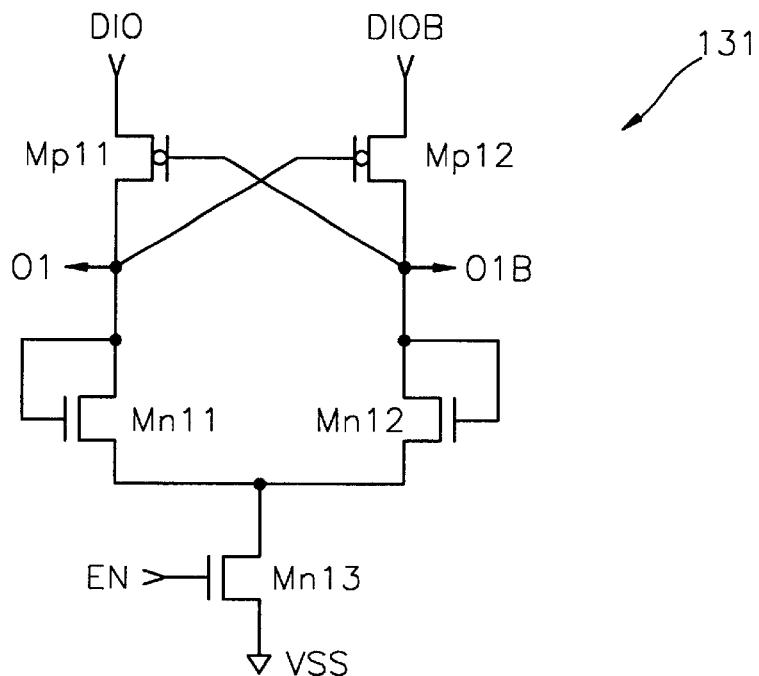
FIG. 3 is a circuit diagram of a current sense amplifier (CSA) shown in FIG. 2.
Figure 4:
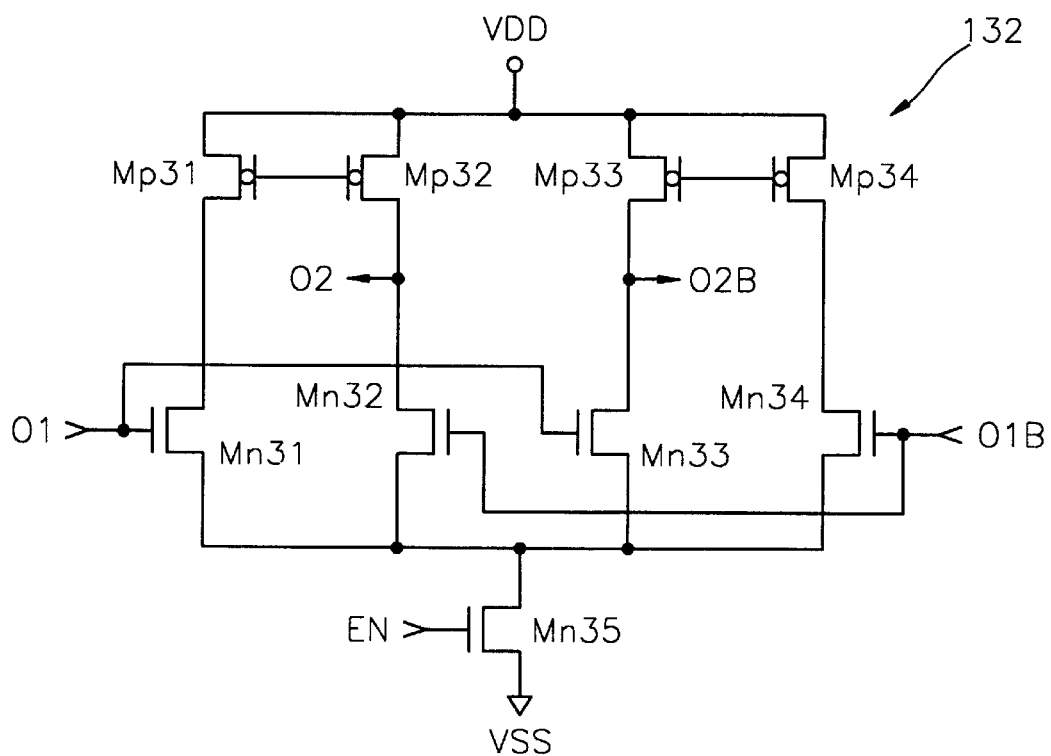
FIG. 4 is a circuit diagram of a voltage sense amplifier (VSA) shown in FIG. 2.
Figure 5:
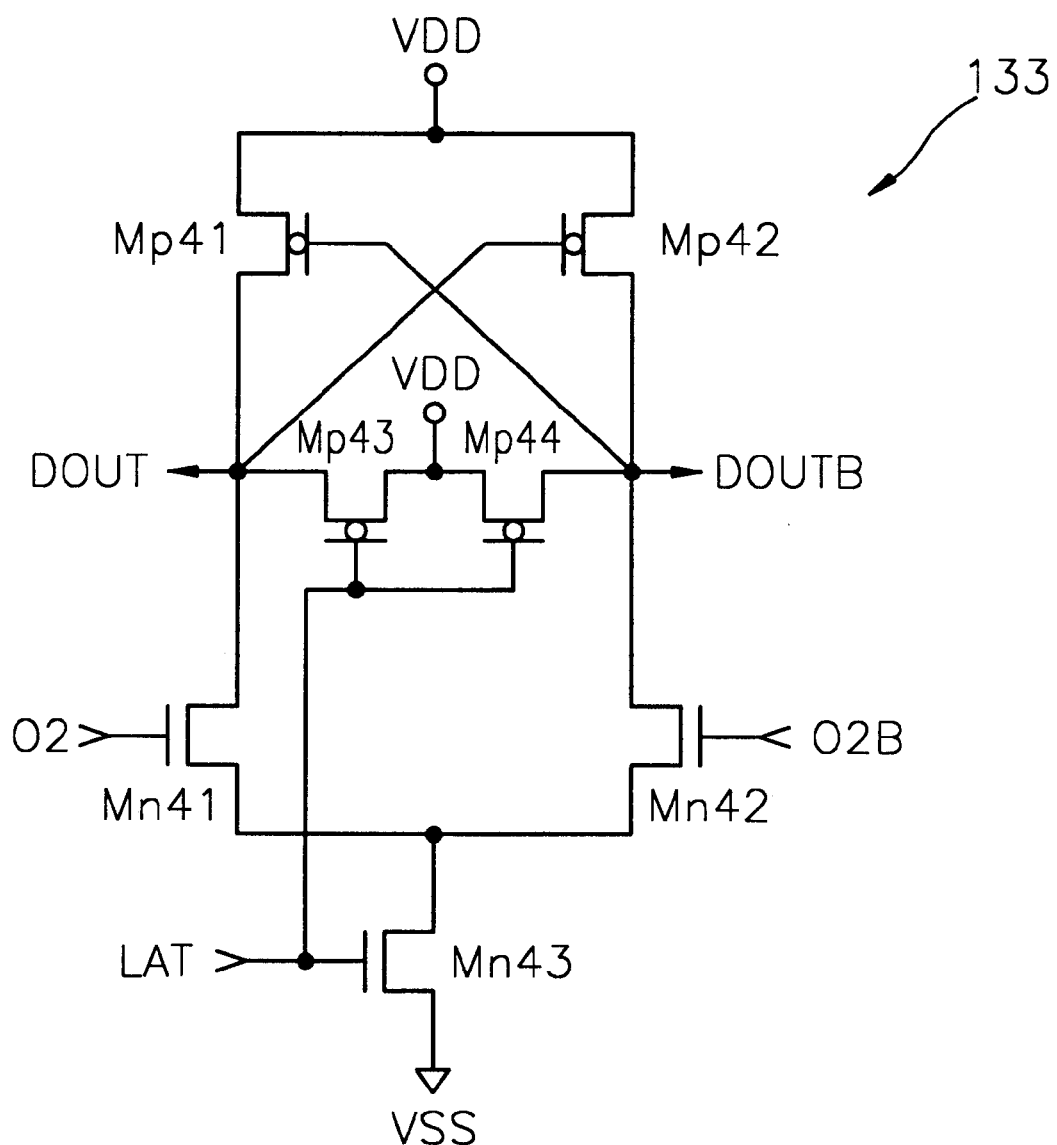
FIG. 5 is a circuit diagram of a latch shown in FIG. 2.

Attached drawings for illustrating a preferred embodiment of the present invention and the contents written on the attached drawings must be referred to in order to gain sufficient understanding of the merits of the present invention and the operation thereof and the objective accomplished by the operation of the present invention.

Hereinafter, the present invention will be described in detail by explaining a preferred embodiment of the present invention with reference to the attached drawings. Like reference numerals in the drawings denote the same members.

Figure 6:
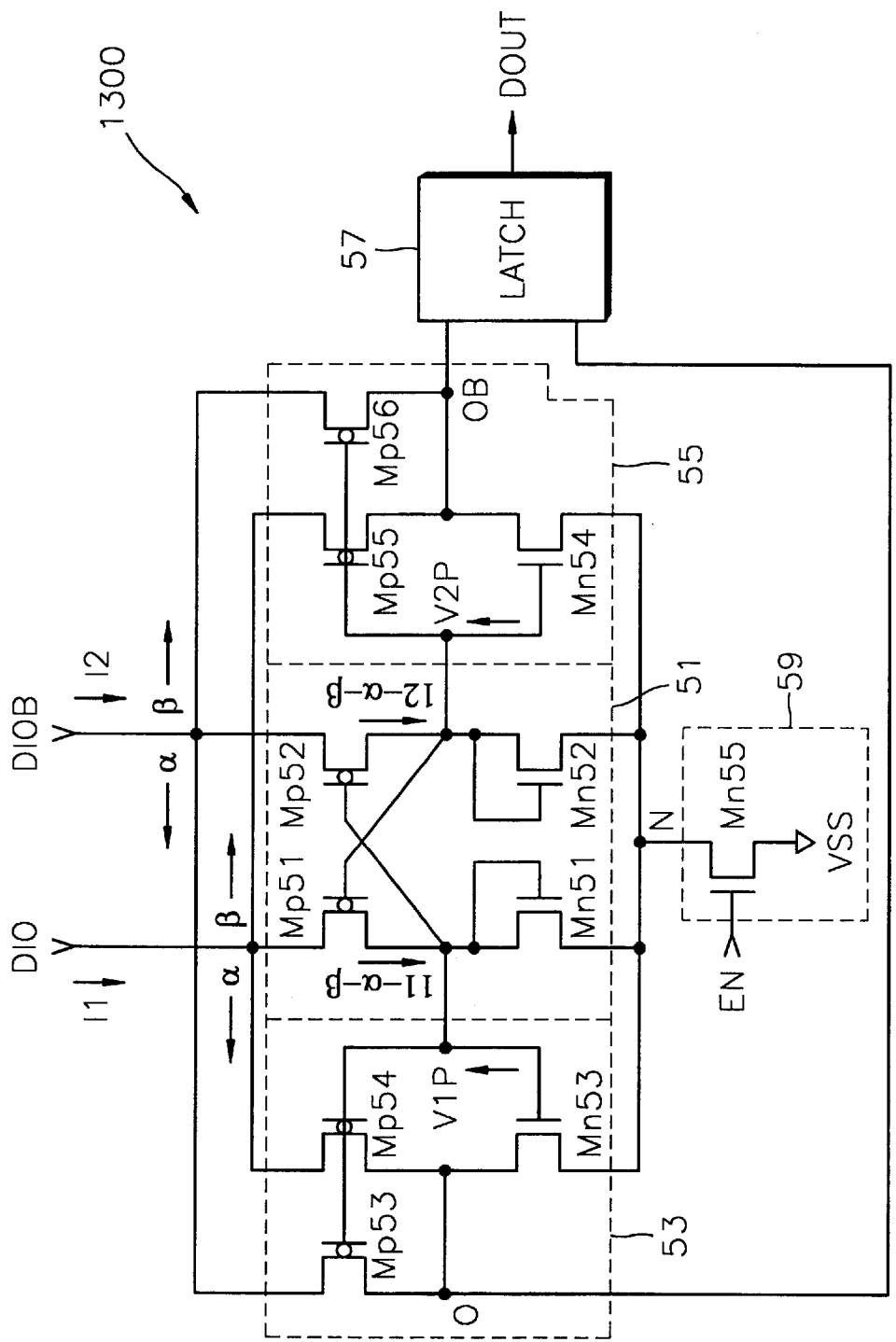
FIG. 6 is a circuit diagram of an input-output line sense amplifier (IOSA) of a semiconductor memory device according to an embodiment of the present invention.

FIG. 6 is a circuit diagram of an input-output line sense amplifier (IOSA) 1300 of a semiconductor memory device made according to an embodiment of the present invention. It may be used in place of IOSA 13 of FIG. 1.

Referring to FIG. 6, the input-output line sense amplifier (IOSA) includes a current sensing circuit 51, a first amplifier 53, a second amplifier 55, an enabler 59, and a latch 57.

Importantly, the sensed current is divided between the current sensing circuit 51, and the first amplifier 53 and second amplifier 55.

Current sensing circuit 51 thus senses only a first portion of the signal current from DIO (not all of it), and only a first portion of the complementary current from DIOB (not all of it). The current sensing circuit 51 senses the current through a pair of input-output lines, i.e., an input-output line DIO and a complementary input-output line DIOB which transmit data read from predetermined memory cells in a semiconductor memory device.

The first amplifier 53 operates from a second portion $\alpha 1$ of the signal current, and a second portion $\alpha 2$ of the complementary current. Thus it generates an output signal from a first detected output of the current sensing circuit.

The invention works best if the second portion of the signal current corresponds to an equal fraction of the signal current as the second portion of the complementary current. In other words, it is highly preferred that $\alpha 1 = \alpha 2 = \alpha$.

In the preferred embodiment, the first amplifier 53 passes the same amount of a first current $\alpha$ from the input-output line DIO and the complementary input-output line DIOB, amplifies and inverts an output signal V1P of the current sensing circuit 51 using the first current $\alpha$, and outputs an amplified and inverted signal to a first output terminal O.

The second amplifier 55 operates from a third portion $\beta 1$ of the signal current and a third portion $\beta 2$ of the complementary current. Thus it generates an output signal from a second detected output of the current sensing circuit.

Similarly to the above, it is highly preferred that $\beta 1 = \beta 2 = \beta$.

In the preferred embodiment, the second amplifier 55 passes the same amount of a second current $\beta$ from the input-output line DIO and the complementary input-output line DIOB, amplifies and inverts an output signal V2P of the current sensing circuit 51 using the second current $\beta$, and outputs an amplified and inverted signal to a second output terminal OB.

The enabler 59 enables the current sensing circuit 51, the first amplifier 53, and the second amplifier 55 in response to an enabling signal EN. The latch 57 latches signals of the first and second output terminals O and OB and converts the signals into a CMOS level.

The current sensing circuit 51 includes two PMOS transistors Mp51 and Mp52 and two NMOS transistors Mn51 and Mn52. The PMOS transistor Mp51, which is a current sensing transistor sensing the current through the input-output line DIO, is coupled to the input-output line DIO and a node that the output signal V1P is output from. The PMOS transistor Mp52, which is a current sensing transistor sensing the current through the complementary input-output line DIOB, is coupled to the complementary input-output line DIOB and a node that the complementary output signal V2P is output from.

The PMOS transistors Mp51 and Mp52 are cross-coupled to each other. In other words, a gate of the PMOS transistor Mp51 is coupled to the node that the complementary output signal V2P is output from, and a gate of the PMOS transistor Mp52 is coupled to the node that the output signal V1P is output from.

The NMOS transistor Mn51, which is a load transistor serving as resistance, is coupled to the node that the output signal V1P is output from, and a common node N. The NMOS transistor Mn51 has a diode from where a drain and a gate are commonly coupled to the node that the output signal V1P is output from.

The NMOS transistor Mn52, which is a load transistor serving as resistance, is coupled to the node that the output signal V2P is output from, and the common node N. The NMOS transistor Mn52 has a diode from where a drain and a gate are commonly coupled to the node that the complementary output signal V2P is output from. The first amplifier 53 includes PMOS transistors Mp53 and Mp54 and an NMOS transistor Mn53.

The PMOS transistor Mp53 is coupled to the complementary input-output line DIOB and the first output terminal O and is controlled by the output signal V1P of the current sensing circuit 51. The PMOS transistor Mp54 is coupled to the input-output line DIO and the first output terminal O and is controlled by the output signal V1P of the current sensing circuit 51. The NMOS transistor Mn53 is coupled to the first output terminal O and the common node N and is controlled by the output signal V1P of the current sensing circuit 51.

It was described above how it is desired to have $\alpha 1 = \alpha 2$ for the present invention. This is accomplished by having a width to length ratio of the PMOS transistor Mp53 equal that of the PMOS transistor Mp54. In the more specific case, it is preferable that the width of the PMOS transistor Mp53 be the same as the width of the PMOS transistor Mp54 and the length of the PMOS transistor Mp53 be the same as the length of the PMOS transistor Mp54. The second amplifier 55 includes two PMOS transistors Mp55 and Mp56 and an NMOS transistor Mn54.

The PMOS transistor Mp55 is coupled to the input-output line DIO and the second output terminal OB and is controlled by the complementary output signal V2P of the current sensing circuit 51. The PMOS transistor Mp56 is coupled to the complementary input-output line DIOB and the second output terminal OB and is controlled by the complementary V2P of the current sensing circuit 51. The NMOS transistor Mn54 is coupled to the second output terminal OB and the common node N and is controlled by the complementary output signal V2P of the current sensing circuit 51.

It was described above how it is desired to have $\beta 1 = \beta 2$ for the present invention. This is accomplished by having a width to length ratio of the PMOS transistor Mp55 equal that of the PMOS transistor Mp56. In the more specific case, it is preferable that the width of PMOS transistor Mp55 be the same as the width of the PMOS transistor Mp56 and the length of the PMOS transistor Mp55 be the same as the length of the PMOS transistor Mp56.

The enabler 59 includes the NMOS transistor Mn55 which is coupled to the common node N and a ground voltage VSS and is controlled by the enabling signal EN. The enabler 59 may be excluded from the input-output line sense amplifier (IOSA) shown in FIG. 6. In this case, ends of the NMOS transistors Mn51 through Mn54 are directly coupled to the ground voltage VSS.

Hereinafter, the structure and operation of the input-output line amplifier (IOSA) according to the embodiment of the present invention will be more described with reference to FIG. 6. The input-output line sense amplifier (IOSA) is a circuit that the current sensing circuit 51 and the first and second amplifiers 53 and 55 combine into. The current sensing circuit 51 is optimized to have nearly zero of an input resistance so that input current is maximized. Here, the input-output line DIO and the complementary input-output line DIOB have nearly the same voltage levels.

In the first amplifier 53, if the width and length of the PMOS transistor Mp53 are equal to the width and length of the PMOS transistor Mp54, the PMOS transistors Mp53 and Mp54 have the same voltage between their respective gates and sources. Thus, the PMOS transistors Mp53 and Mp54 each pass the same amount of a first current α from the complementary input-output line DIOB and the input-output line DIO.

In the second amplifier 55, if the width and length of the PMOS transistor Mp55 are equal to the width and length of the PMOS transistor Mp56, the PMOS transistors Mp55 and Mp56 have the same voltage between their respective gates and sources. Thus, the PMOS transistors Mp55 and Mp56 each pass a same amount of second current β from the input-output line DIO and the complementary input-output line DIOB.

In the current sensing circuit 51, the NMOS transistor Mn51 is supplied with current I1 -α-β, and the NMOS transistor Mn52 is supplied with current I2-α-β. Here, I1 is current supplied via the input-output line DIO and I2 is current supplied via the complementary input-output line DIOB. Thus, the difference between currents I1-α-β and I2-α-β is I1-I2, and thus the current sensing circuit 51 is not affected by the magnitude of differential input current.

The first current α is used to amplify the output signal V1P of the current sensing circuit 51. In other words, the PMOS transistors Mp53 and Mp54 and the NMOS transistor Mn53 in the first amplifier 53 combine into an inverter which amplifies and inverts the output signal V1P of the current sensing circuit 51 using the first current α.

The output signal V1P of the current sensing circuit 51 supplies a bias voltage which operates the inverted type-first amplifier 53 with an optimum bias condition. That is why the output signal V1P forms an operating point near a threshold voltage of the inverter type-first amplifier 53 by the voltage dividing operation of the PMOS and NMOS transistors Mp51 and Mn51. In other words, the output signal V1P automatically supplies a bias voltage having a similar value to that of the threshold voltage of the inverter type-first amplifier 53 regardless of temperature and variations in a process if the ratio W/L (W is the width of a transistor and L is the length of a transistor) is optimized so that the W/L ratio of Mp51:Mn51 is equal to the W/L ratio of (Mp53+Mp54):Mn53.

The second current β is used to amplify the complementary output signal V2P of the current sensing circuit 51. In other words, the PMOS transistors Mp55 and Mp56 and the NMOS transistor Mn54 in the second amplifier 55 form an inverter which amplifies and inverts the complementary output signal V2P of the current sensing circuit 51 using the second current β.

The complementary output signal V2P of the current sensing circuit 51 supplies a bias current which operates the inverter type-second amplifier 55 with an optimum bias condition. That is why the output signal V2P forms an operating point near a threshold voltage of the inverter type-second amplifier 55 by the voltage dividing operation of the PMOS and NMOS transistors Mp52 and Mn52. In other words, the output signal V2P automatically supplies a bias voltage having a similar value to that of the threshold voltage of the inverter type-second amplifier 55 regardless of temperature and variations in a process if the ratio W/L is optimized so that the W/L ratio of Mp52:Mn52 is equal to the W/L ratio of (Mp55+Mp56):Mn54.

As described above, the input-output line sense amplifier according to the present invention is a circuit that the current sensing circuit 51 and the first and second amplifiers 53 and 55 combine into, and it does not include a voltage sense amplifier of a differential amplifier structure while the input-output line sense amplifier according to the prior art does.

Thus, the input-output line sense amplifier according to the present invention consumes a low amount of current and direct current (DC).

A preferred embodiment of the present invention has been described with reference to the drawings. However, it will be apparent to one of ordinary skill in the art that modifications to the described embodiment may be made without departing from the spirit and scope of the invention. Consequently, the technical protection range of the present invention should be determined by the appended claims.

What is claimed is:

1. An input-output line sense amplifier of a semiconductor memory device for sensing a signal current and a complementary current, the input-output line sense amplifier comprising:

a current sensing circuit for sensing a first portion of the signal current and a first portion of the complementary current;

a first amplifier operating from a second portion of the signal current and a second portion of the complementary current to generate an output signal from a first detected output of the current sensing circuit;

a second amplifier operating from a third portion of the signal current and a third portion of the complementary current to generate an output signal from a second detected output of the current sensing circuit; and a latch to receive the output signals generated by the first and second amplifiers.

2. The amplifier of claim 1, in which
the second portion of the signal current corresponds to an equal fraction of the signal current as the second portion of the complementary current.

3. The amplifier of claim 1, in which the first amplifier includes:

first and second transistors coupled to each other and controlled by the first detected output, the first transistor coupled to receive the second portion of the signal current, and a third transistor controlled by the first detected output, coupled to the first and second transistors, and further coupled to receive the second portion of the complementary current.

4. The amplifier of claim 3, in which
a width to length ratio of the first transistor equals that of the third transistor.

5. An input-output line sense amplifier of a semiconductor memory device which senses an input-output line and a complementary input-output line transmitting data read from a memory cell, the input-output line sense amplifier comprising:

a current sensing circuit for sensing current through the input-output line and the complementary input-output line;

a first amplifier for passing the same amount of a first current from the input-output line and the complementary input-output line, amplifying and inverting an output signal of the current sensing circuit using the first current, and outputting an amplified and inverted signal to a first output terminal; and a second amplifier for passing the same amount of a second current from the input-output line and the complementary input-output line, amplifying and inverting a complementary output signal of the current sensing circuit using the second current, and outputting an amplified and inverted signal to a second output terminal.

6. The amplifier of claim 5, wherein the current sensing circuit comprises:

a first current sensing transistor coupled to the input-output line and a first node which the output signal is output from;

a second current sensing transistor coupled to the complementary input-output line and a second node which the complementary output signal is output from;

a first load transistor coupled to the first node and a ground voltage; and a second load transistor coupled to the second node and the ground voltage.

7. The amplifier of claim 6, wherein the first amplifier comprises:

a first transistor coupled to the complementary input-output line and the first output terminal and controlled by the output signal of the current sensing circuit;

a second transistor coupled to the input-output line and the first output terminal and controlled by the output signal of the current sensing circuit; and a third transistor coupled to the first output terminal and the ground voltage and controlled by the output signal of the current sensing circuit.

8. The amplifier of claim 7, wherein the second amplifier comprises:

a fourth transistor coupled to the input-output line and the second output terminal and controlled by the complementary output signal of the current sensing circuit;

a fifth transistor coupled to the complementary input-output line and the second output terminal and controlled by the complementary output signal of the current sensing circuit; and a sixth transistor coupled to the second output terminal and the ground voltage and controlled by the complementary output signal of the current sensing circuit.

9. The amplifier of claim 8, further comprising:

an enabler connected between the ground voltage and a third node to which an end of the first load transistor, an end of the second load transistor, an end of the third transistor, and an end of the sixth transistor are commonly coupled, the enabler for enabling the current sensing circuit and the first and second amplifiers in response to an enabling signal.

10. The amplifier of claim 7, in which a width and a length of the first transistor are equal to a width and a length of the second transistor.

11. The amplifier of claim 8, in which a width and a length of the fourth transistor are equal to a width and a length of the fifth transistor.

* * * * *